United States Patent
Sirinorakul

(10) Patent No.: US 9,449,905 B2
(45) Date of Patent: Sep. 20, 2016

(54) PLATED TERMINALS WITH ROUTING INTERCONNECTIONS SEMICONDUCTOR DEVICE

(71) Applicant: UTAC Thai Limited, Bangkok (TH)

(72) Inventor: Saravuth Sirinorakul, Bangkok (TH)

(73) Assignee: UTAC THAI LIMITED, Bangkok (TH)

( * ) Notice: Subject to any disclaimer, the term of this patent is extended or adjusted under 35 U.S.C. 154(b) by 34 days.

(21) Appl. No.: 13/851,007

(22) Filed: Mar. 26, 2013

(65) Prior Publication Data

US 2013/0299979 A1 Nov. 14, 2013

Related U.S. Application Data

(60) Provisional application No. 61/645,560, filed on May 10, 2012.

(51) Int. Cl.
*H01L 23/48* (2006.01)
*H01L 23/52* (2006.01)
(Continued)

(52) U.S. Cl.
CPC ....... *H01L 23/49816* (2013.01); *H01L 23/481* (2013.01); *H01L 24/97* (2013.01);
(Continued)

(58) Field of Classification Search
CPC ................ H01L 2924/00; H01L 2224/73265; H01L 2224/48247; H01L 2224/48227; H01L 2924/15311; H01L 2924/01082; H01L 2224/85; H01L 23/3107; H01L 2224/48257; H01L 2924/14; H01L 24/49; H01L 2224/83; H01L 24/45; H01L 2224/16; H01L 2224/81

USPC ................ 257/E23.124, E23.046, 676, 666, 257/E23.043, 787, E23.092, E25.023, 257/E23.069, 678, E23.037, E21.504, 690, 257/777, 784, E21.502, E23.052, 778, 796, 257/E23.039, 684, 686, 706, 712, 738, 257/E23.031, E23.101, E29.022, 673, 675, 257/691, 692, 786, E21.51, E23.054, 257/E23.065, E23.19, 670, 693, 704, 707, 257/713, 717, 730, 737, E21.506, E23.004, 257/E23.042, E23.049, E23.061, E23.09, 257/E23.125, E23.14, E25.013, 680, 723, 257/773, E21.503, E21.599, E23.021, 257/E23.044, E23.047, E23.051, E23.114, 257/E23.126, E23.128, E23.135, 668, 672, 257/698, 7; 438/123, 106, 112, 111, 124, 438/113, 121, 127, 122, 108, 109, 107, 745, 438/754, 110, 125, 15, 460, 114, 115, 116, 438/118, 120, 126, 614, 617, 689, 691, 706, 438/710, 720

See application file for complete search history.

(56) References Cited

U.S. PATENT DOCUMENTS 3,611,061 A 10/1971 Segerson
4,411,719 A 10/1983 Lindberg
(Continued)

OTHER PUBLICATIONS

Office Action mailed on Nov. 2, 2015, U.S. Appl. No. 12/834,688, filed Jul. 12, 2010, Saravuth Sirinorakul, 17 pages.

*Primary Examiner* — Su C Kim
*Assistant Examiner* — Junaiden Mirsalahuddin
(74) *Attorney, Agent, or Firm* — Haverstock & Owens LLP

(57) ABSTRACT

A semiconductor package includes terminals, each having an exposed surface that is flush with a bottom surface of the semiconductor package, and a layer of interconnection routings disposed within the semiconductor package. At least one interconnection routing is electrically coupled with a terminal and extends planarly therefrom. The semiconductor package also includes at least one die coupled with the layer of interconnection routings. In some embodiments, the semiconductor package also includes one or more additional intermediary layers. Each intermediary layer includes a via layer and an associated routing layer. The associated routing layer includes associated routings. At least one associated routing is electrically coupled with a terminal and extends planarly therefrom. Each via layer couples two routing layers. The semiconductor package also includes a locking mechanism for fastening a package compound with the interconnection routings and the terminals.

16 Claims, 13 Drawing Sheets

(51) Int. Cl.
*H01L 29/40* (2006.01)
*H01L 23/498* (2006.01)
*H01L 23/00* (2006.01)

(52) U.S. Cl.
CPC ........... *H01L2224/45144* (2013.01); *H01L 2224/45147* (2013.01); *H01L 2224/48091* (2013.01); *H01L 2224/73265* (2013.01); *H01L 2924/01047* (2013.01); *H01L 2924/12042* (2013.01); *H01L 2924/15747* (2013.01); *H01L 2924/181* (2013.01)

(56) References Cited

U.S. PATENT DOCUMENTS

| | | | |
|---|---|---|---|
| 4,501,960 A | 2/1985 | Jouvet et al. |
| 4,801,561 A | 1/1989 | Sankhagowit |
| 4,855,672 A | 8/1989 | Shreeve |
| 5,105,259 A | 4/1992 | McShane et al. |
| 5,195,023 A | 3/1993 | Manzione et al. |
| 5,247,248 A | 9/1993 | Fukunaga |
| 5,248,075 A | 9/1993 | Young et al. |
| 5,281,851 A | 1/1994 | Mills et al. |
| 5,396,185 A | 3/1995 | Honma et al. |
| 5,397,921 A | 3/1995 | Karnezos |
| 5,479,105 A | 12/1995 | Kim et al. |
| 5,535,101 A | 7/1996 | Miles et al. |
| 5,596,231 A | 1/1997 | Combs |
| 5,843,808 A | 12/1998 | Karnezos |
| 5,959,363 A | 9/1999 | Yamada et al. |
| 5,990,692 A | 11/1999 | Jeong et al. |
| 6,072,239 A | 6/2000 | Yoneda et al. |
| 6,111,324 A | 8/2000 | Sheppard et al. |
| 6,159,770 A | 12/2000 | Tetaka et al. |
| 6,177,729 B1 | 1/2001 | Benenati et al. |
| 6,197,615 B1 | 3/2001 | Song et al. |
| 6,208,020 B1 | 3/2001 | Minamio et al. |
| 6,229,200 B1 | 5/2001 | Mclellan et al. |
| 6,242,281 B1 | 6/2001 | Mclellan et al. |
| 6,250,841 B1 | 6/2001 | Ledingham |
| 6,284,569 B1 | 9/2001 | Sheppard et al. |
| 6,285,075 B1 | 9/2001 | Combs et al. |
| 6,294,100 B1 | 9/2001 | Fan et al. |
| 6,304,000 B1 | 10/2001 | Isshiki et al. |
| 6,326,678 B1 | 12/2001 | Karnezos et al. |
| 6,329,711 B1 | 12/2001 | Kawahara et al. |
| 6,353,263 B1 | 3/2002 | Dotta et al. |
| 6,376,921 B1 | 4/2002 | Yoneda et al. |
| 6,392,427 B1 | 5/2002 | Yang |
| 6,414,385 B1 | 7/2002 | Huang et al. |
| 6,429,048 B1 | 8/2002 | McLellan et al. |
| 6,451,709 B1 | 9/2002 | Hembree |
| 6,455,348 B1 | 9/2002 | Yamaguchi |
| 6,489,218 B1 | 12/2002 | Kim et al. |
| 6,498,099 B1 | 12/2002 | McLellan et al. |
| 6,507,116 B1 | 1/2003 | Caletka et al. |
| 6,545,332 B2 | 4/2003 | Huang |
| 6,545,347 B2 | 4/2003 | McClellan |
| 6,552,417 B2 | 4/2003 | Combs |
| 6,552,423 B2 | 4/2003 | Song et al. |
| 6,566,740 B2 | 5/2003 | Yasunaga et al. |
| 6,573,121 B2 | 6/2003 | Yoneda et al. |
| 6,585,905 B1 | 7/2003 | Fan et al. |
| 6,586,834 B1 | 7/2003 | Sze et al. |
| 6,635,957 B2 | 10/2003 | Kwan et al. |
| 6,667,191 B1 | 12/2003 | McLellan et al. |
| 6,683,368 B1 | 1/2004 | Mostafazadeh |
| 6,686,667 B2 | 2/2004 | Chen et al. |
| 6,703,696 B2 | 3/2004 | Ikenaga et al. |
| 6,723,585 B1 | 4/2004 | Tu et al. |
| 6,724,071 B2 | 4/2004 | Combs |
| 6,734,044 B1 | 5/2004 | Fan et al. |
| 6,734,552 B2 | 5/2004 | Combs et al. |
| 6,737,755 B1 | 5/2004 | McLellan et al. |
| 6,764,880 B2 | 7/2004 | Wu et al. |
| 6,781,242 B1 | 8/2004 | Fan et al. |
| 6,800,948 B1 | 10/2004 | Fan et al. |
| 6,812,552 B2 | 11/2004 | Islam et al. |
| 6,818,472 B1 | 11/2004 | Fan et al. |
| 6,818,978 B1 | 11/2004 | Fan |
| 6,818,980 B1 | 11/2004 | Pedron, Jr. |
| 6,841,859 B1 | 1/2005 | Thamby et al. |
| 6,876,066 B2 | 4/2005 | Fee et al. |
| 6,893,169 B1 | 5/2005 | Exposito et al. |
| 6,894,376 B1 | 5/2005 | Mostazadeh et al. |
| 6,897,428 B2 | 5/2005 | Minamio et al. |
| 6,927,483 B1 | 8/2005 | Lee et al. |
| 6,933,176 B1 | 8/2005 | Kirloskar et al. |
| 6,933,594 B2 | 8/2005 | McLellan et al. |
| 6,940,154 B2 | 9/2005 | Pedron et al. |
| 6,946,324 B1 | 9/2005 | McLellan et al. |
| 6,964,918 B1 | 11/2005 | Fan et al. |
| 6,967,126 B2 | 11/2005 | Lee et al. |
| 6,979,594 B1 | 12/2005 | Fan et al. |
| 6,982,491 B1 | 1/2006 | Fan et al. |
| 6,984,785 B1 | 1/2006 | Diao et al. |
| 6,989,294 B1 | 1/2006 | McLellan et al. |
| 6,995,460 B1 | 2/2006 | McLellan et al. |
| 7,008,825 B1 | 3/2006 | Bancod et al. |
| 7,009,286 B1 | 3/2006 | Kirloskar et al. |
| 7,045,883 B1 | 5/2006 | McCann et al. |
| 7,049,177 B1 | 5/2006 | Fan et al. |
| 7,052,935 B2 | 5/2006 | Pai et al. |
| 7,060,535 B1 | 6/2006 | Sirinorakul et al. |
| 7,071,545 B1 | 7/2006 | Patel et al. |
| 7,091,581 B1 | 8/2006 | McLellan et al. |
| 7,101,210 B2 | 9/2006 | Lin et al. |
| 7,102,210 B2 | 9/2006 | Ichikawa |
| 7,125,747 B2 | 10/2006 | Lee et al. |
| 7,126,218 B1 | 10/2006 | Darveaux et al. |
| 7,205,178 B2 | 4/2007 | Shiu et al. |
| 7,224,048 B1 | 5/2007 | McLellan et al. |
| 7,247,526 B1 | 7/2007 | Fan et al. |
| 7,253,503 B1 | 8/2007 | Fusaro et al. |
| 7,259,678 B2 | 8/2007 | Brown et al. |
| 7,274,088 B2 | 9/2007 | Wu et al. |
| 7,314,820 B2 | 1/2008 | Lin et al. |
| 7,315,077 B2 | 1/2008 | Choi et al. |
| 7,315,080 B1 | 1/2008 | Fan et al. |
| 7,342,305 B1 | 3/2008 | Diao et al. |
| 7,344,920 B1 | 3/2008 | Kirloskar et al. |
| 7,348,663 B1 | 3/2008 | Kirloskar et al. |
| 7,358,119 B2 | 4/2008 | McLellan et al. |
| 7,371,610 B1 | 5/2008 | Fan et al. |
| 7,372,151 B1 | 5/2008 | Fan et al. |
| 7,381,588 B1 | 6/2008 | Patel et al. |
| 7,399,658 B2 | 7/2008 | Shim et al. |
| 7,408,251 B2 | 8/2008 | Hata et al. |
| 7,411,289 B1 | 8/2008 | McLellan et al. |
| 7,449,771 B1 | 11/2008 | Fan et al. |
| 7,459,345 B2 | 12/2008 | Hwan |
| 7,482,690 B1 | 1/2009 | Fan et al. |
| 7,495,319 B2 | 2/2009 | Fukuda et al. |
| 7,507,603 B1 | 3/2009 | Berry et al. |
| 7,595,225 B1 | 9/2009 | Fan et al. |
| 7,608,484 B2 | 10/2009 | Lange et al. |
| 7,709,857 B2 | 5/2010 | Kim et al. |
| 7,714,418 B2 | 5/2010 | Lim et al. |
| 8,035,207 B2 | 10/2011 | Camacho et al. |
| 2001/0005047 A1 | 6/2001 | Jimarez et al. |
| 2002/0109214 A1 | 8/2002 | Minamio et al. |
| 2003/0006055 A1 | 1/2003 | Chien-Hung et al. |
| 2003/0045032 A1 | 3/2003 | Abe |
| 2003/0071333 A1 | 4/2003 | Matsuzawa |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2003/0234454 A1* | 12/2003 | Pedron et al. ............. 257/787 |
| 2004/0014257 A1 | 1/2004 | Kim et al. |
| 2004/0026773 A1 | 2/2004 | Koon et al. |
| 2004/0046237 A1 | 3/2004 | Abe et al. |
| 2004/0046241 A1 | 3/2004 | Combs et al. |
| 2004/0070055 A1 | 4/2004 | Punzalan et al. |
| 2004/0080025 A1* | 4/2004 | Kasahara et al. ............ 257/666 |

(56) References Cited

U.S. PATENT DOCUMENTS

| | | |
|---|---|---|
| 2004/0110319 A1 | 6/2004 | Fukutomi et al. |
| 2005/0003586 A1 | 1/2005 | Shimanuki et al. |
| 2005/0077613 A1 | 4/2005 | McLellan et al. |
| 2005/0236701 A1 | 10/2005 | Minamio et al. |
| 2005/0263864 A1 | 12/2005 | Islam et al. |
| 2006/0071351 A1 | 4/2006 | Lange |
| 2006/0170081 A1* | 8/2006 | Gerber et al. ............ 257/666 |
| 2006/0192295 A1 | 8/2006 | Lee et al. |
| 2006/0223229 A1 | 10/2006 | Kirloskar et al. |
| 2006/0223237 A1 | 10/2006 | Combs et al. |
| 2006/0237231 A1 | 10/2006 | Hata et al. |
| 2006/0273433 A1 | 12/2006 | Itou et al. |
| 2007/0001278 A1 | 1/2007 | Jeon et al. |
| 2007/0013038 A1 | 1/2007 | Yang |
| 2007/0029540 A1 | 2/2007 | Kajiwara et al. |
| 2007/0200210 A1 | 8/2007 | Zhao et al. |
| 2007/0235217 A1 | 10/2007 | Workman |
| 2008/0048308 A1 | 2/2008 | Lam |
| 2008/0150094 A1 | 6/2008 | Anderson |
| 2009/0014848 A1 | 1/2009 | Ong Wai Lian et al. |
| 2009/0152691 A1 | 6/2009 | Nguyen et al. |
| 2009/0152694 A1 | 6/2009 | Bemmert et al. |
| 2009/0230525 A1 | 9/2009 | Chang Chien et al. |
| 2009/0236713 A1 | 9/2009 | Xu et al. |
| 2010/0133565 A1 | 6/2010 | Cho et al. |
| 2010/0149773 A1 | 6/2010 | Said |
| 2011/0201159 A1 | 8/2011 | Mori et al. |
| 2013/0069221 A1* | 3/2013 | Lee et al. .............. 257/737 |

* cited by examiner

135

140

145

Top, Side View

Bottom, Side View

X-RAY

Bottom, Side View

X-RAY

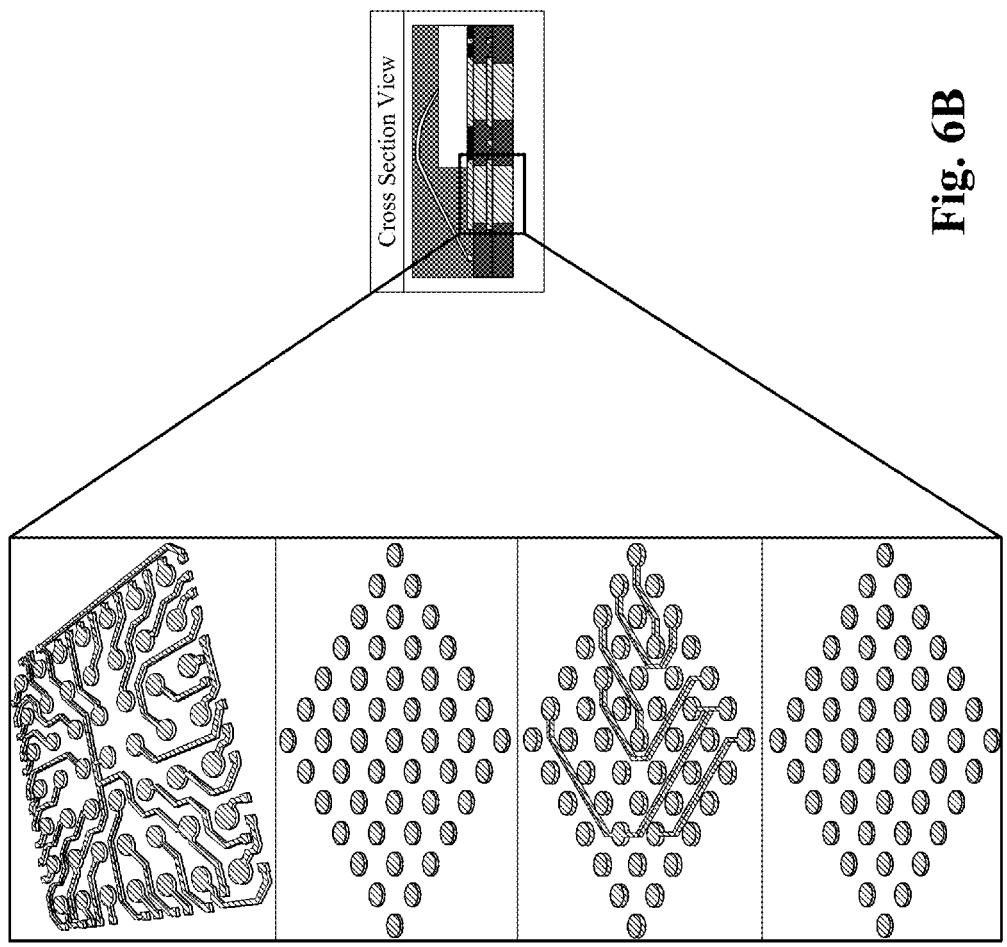

PLATED TERMINALS WITH ROUTING INTERCONNECTIONS SEMICONDUCTOR DEVICE

RELATED APPLICATIONS

This application claims benefit of priority under 35 U.S.C. section 119(e) of the U.S. Provisional Patent Application Ser. No. 61/645,560, filed May 10, 2012, entitled "PLATING TERMINAL AND ROUTING INTERCONNECTION SEMICONDUCTOR DEVICE," which is hereby incorporated by reference in its entirety.

FIELD OF THE INVENTION

The present invention is related to the field of semiconductor devices. More specifically, the present invention relates to plated terminals with routing interconnections semiconductor device.

BACKGROUND

There is a growing demand for high-performance semiconductor packages. However, increases in semiconductor circuit density pose interconnect challenges for a packaged chip's thermal, mechanical and electrical integrity. Thus, there is a need for a semiconductor package with improved routing capabilities.

SUMMARY OF THE DISCLOSURE

Embodiments of the present invention are directed to plated terminals with routing interconnections semiconductor device and a method of manufacturing thereof. A semiconductor package includes terminals, each having an exposed surface that is flush with a bottom surface of the semiconductor package, and a layer of interconnection routings disposed within the semiconductor package. At least one interconnection routing is electrically coupled with a terminal and extends planarly therefrom. The semiconductor package also includes at least one die coupled with the layer of interconnection routings. In some embodiments, the semiconductor package also includes one or more additional intermediary layers. Each intermediary layer includes a via layer and an associated routing layer. The associated routing layer includes associated routings. At least one associated routing is electrically coupled with a terminal and extends planarly therefrom. Each via layer couples two routing layers. The semiconductor package also includes a locking mechanism for fastening a package compound with the interconnection routings and the terminals.

In one aspect, a semiconductor package includes a die, terminals, interconnection routings forming an interconnection routing layer, and a package compound. Each terminal typically includes an exposed surface that is flush with a bottom surface of the semiconductor package. The interconnection routing layer is coupled with the die. The package compound includes a top molding compound encapsulating the interconnection routings and the die, and a bottom molding compound surrounding the terminals. The package compound can include other intermediary molding compounds.

In some embodiments, a shape of an interconnection routing and a terminal electrically coupled with the interconnection routing and any additional layers therebetween is irregular to lock with the package compound. In some embodiments, each layer has width dimensions different from that of adjacent layers. In some embodiments, each layer is formed separately from other layers.

The interconnection routings are electrically coupled with terminals. In some embodiments, at least one of the interconnection routings extends away from a terminal coupled therewith according to a design pattern. In some embodiments, a first of the interconnection routings is coupled with a second of the interconnection routings.

In some embodiments, the semiconductor package also includes wire bonds or solder balls that couple the die with the interconnection routing layer.

In some embodiments, the semiconductor package also includes at least one other die coupled with the die, the interconnection routing layer, or both.

In some embodiments, the semiconductor package also includes solder balls coupled with the terminals. The solder balls extend away from the semiconductor package to increase terminal package stand off.

In some embodiments, the semiconductor package also includes at least one intermediary layer. Each of the at least one intermediary layer includes an associated routing layer and a via layer. The associated routing layer includes associated routings electrically coupled with the terminals. In some embodiments, at least one associated routing electrically extends away from a terminal coupled therewith according to another design pattern. In some embodiments, the via layer includes vias electrically coupled with the terminals.

In another aspect, a semiconductor package includes terminals. Each terminal typically includes an exposed bottom surface. The semiconductor package also includes a primary routing layer positioned within the semiconductor package and includes primary routings electrically coupled with the terminals. At least one of the primary routings extends planarly therefrom. In some embodiments, one of the primary routings is electrically coupled with at least another terminal. The semiconductor package also includes at least one die electrically coupled with the primary routing layer.

In some embodiments, the semiconductor package also includes a locking mechanism for fastening a package compound with the primary routings and the terminals.

In some embodiments, the semiconductor package also includes at least one intermediary layer coupling with the primary routing layer. In some embodiments, the at least one intermediary layer includes an associated routing layer having associated routings electrically coupled with the terminals. At least one of the associated routings extends planarly therefrom. In some embodiments, a pattern formed by the associated routings of the associated routing layer is different from a pattern formed by the primary routings of the primary routing layer. In some embodiments, the intermediary layer also includes a via layer having vias. Each via is electrically coupled with a terminal and extends nonplanarly therefrom.

BRIEF DESCRIPTION OF THE DRAWINGS

The novel features of the invention are set forth in the appended claims. However, for purpose of explanation, several embodiments of the invention are set forth in the following figures.

FIGS. 6A-6B illustrate exemplary results produced at selected steps of the method of FIG. 5.

DETAILED DESCRIPTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein or with equivalent alternatives.

Reference will now be made in detail to implementations of the present invention as illustrated in the accompanying drawings. The same reference indicators will be used throughout the drawings and the following detailed description to refer to the same or like parts.

Embodiments of the present invention are directed to plated terminals with routing interconnections semiconductor device. A semiconductor package includes terminals, each having an exposed surface that is flush with a bottom surface of the semiconductor package, and a layer of interconnection routings disposed within the semiconductor package. At least one interconnection routing is electrically coupled with a terminal and extends planarly therefrom. The semiconductor package also includes at least one die coupled with the layer of interconnection routings. In some embodiments, the semiconductor package also includes one or more additional intermediary layers. Each intermediary layer includes a via layer and an associated routing layer. The associated routing layer includes associated routings. At least one associated routing is electrically coupled with a terminal and extends planarly therefrom. Each via layer couples two routing layers. The semiconductor package also includes a locking mechanism for fastening a package compound with the interconnection routings and the terminals.

Figure 1:
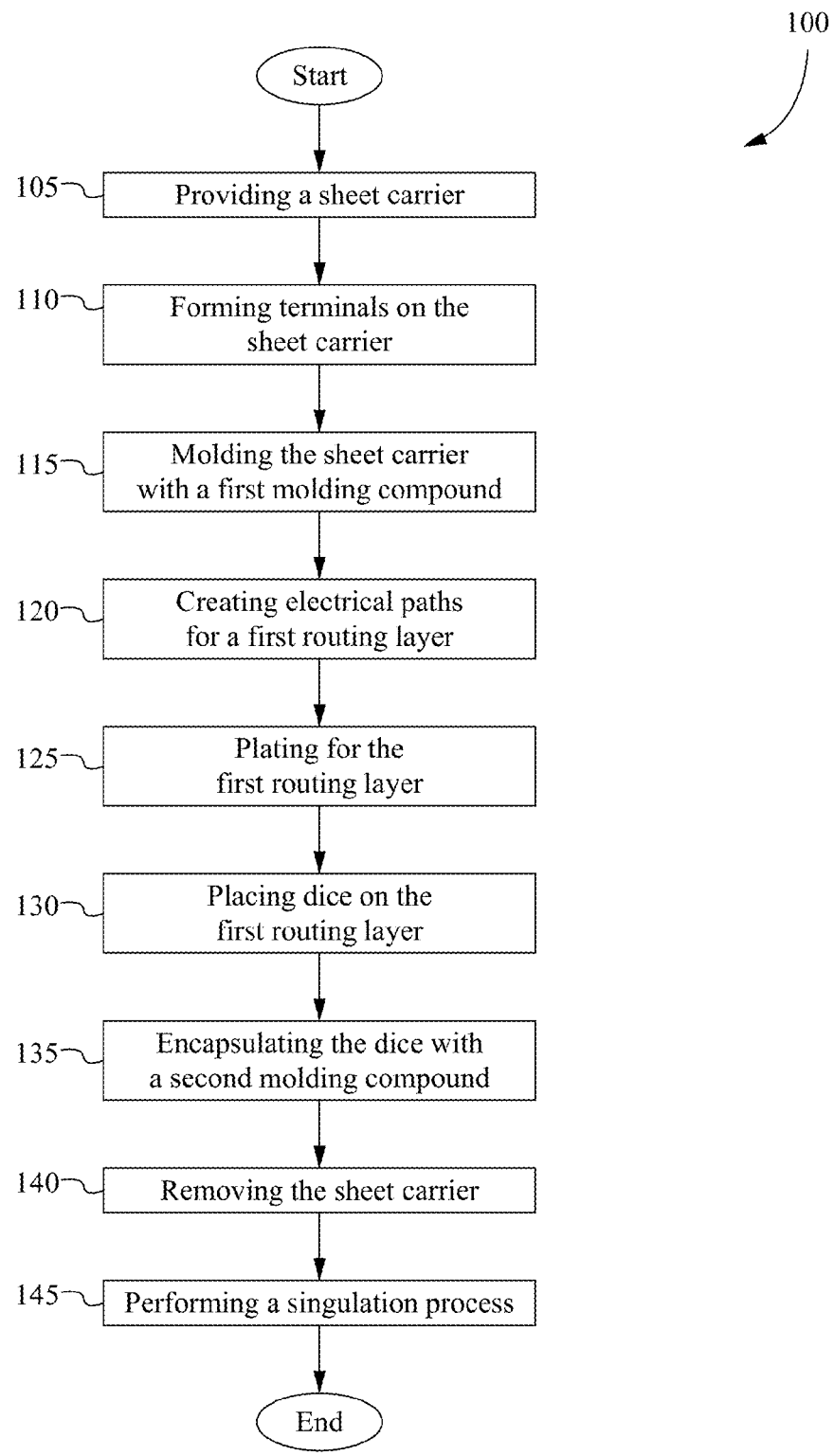
FIG. 1 illustrates an exemplary method of manufacturing a semiconductor package in accordance with the present invention.
Figure 2A:
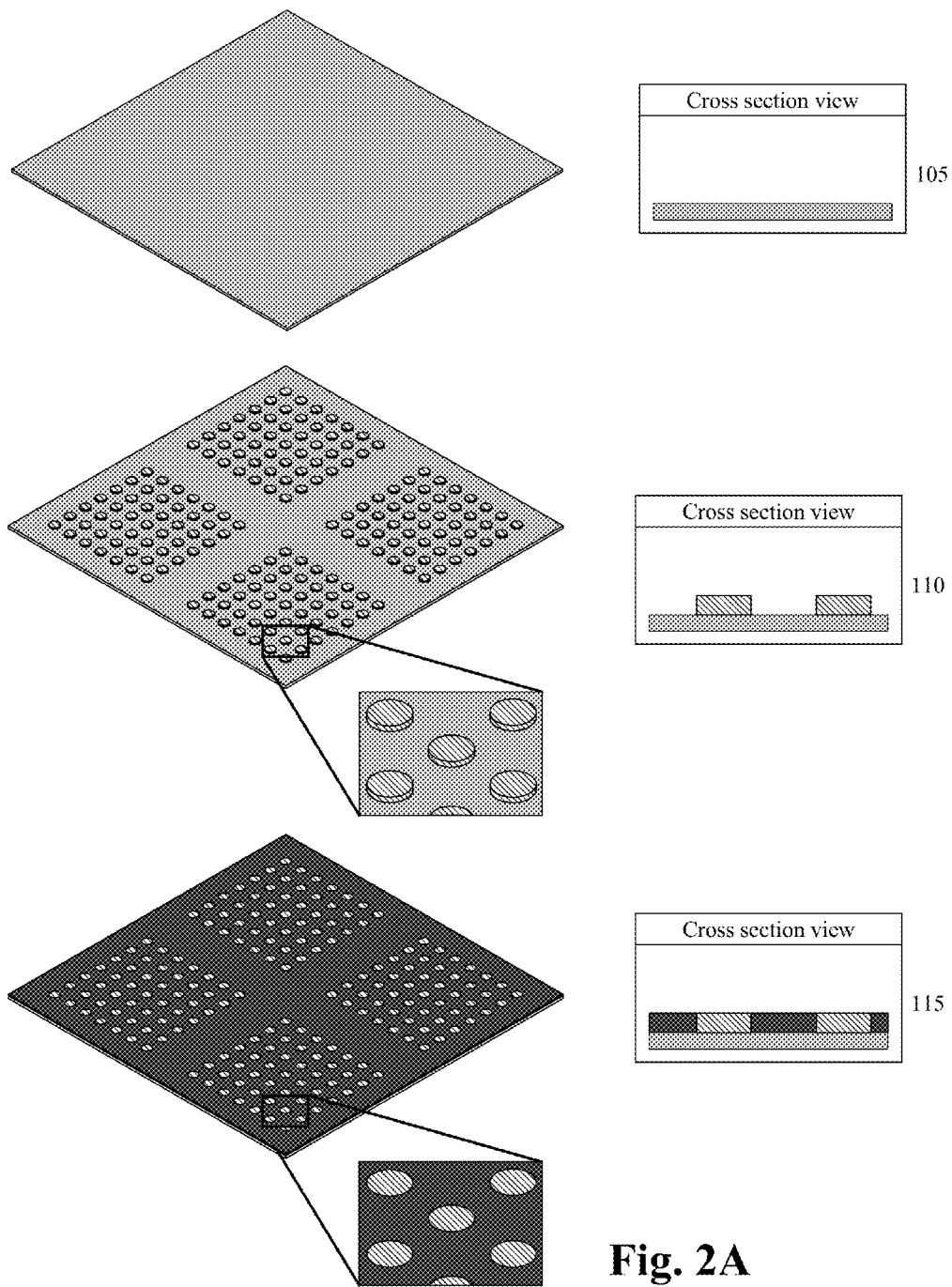
FIGS. 2A-2D illustrate an exemplary result produced at each step of the method of FIG. 1.
Figure 2B:
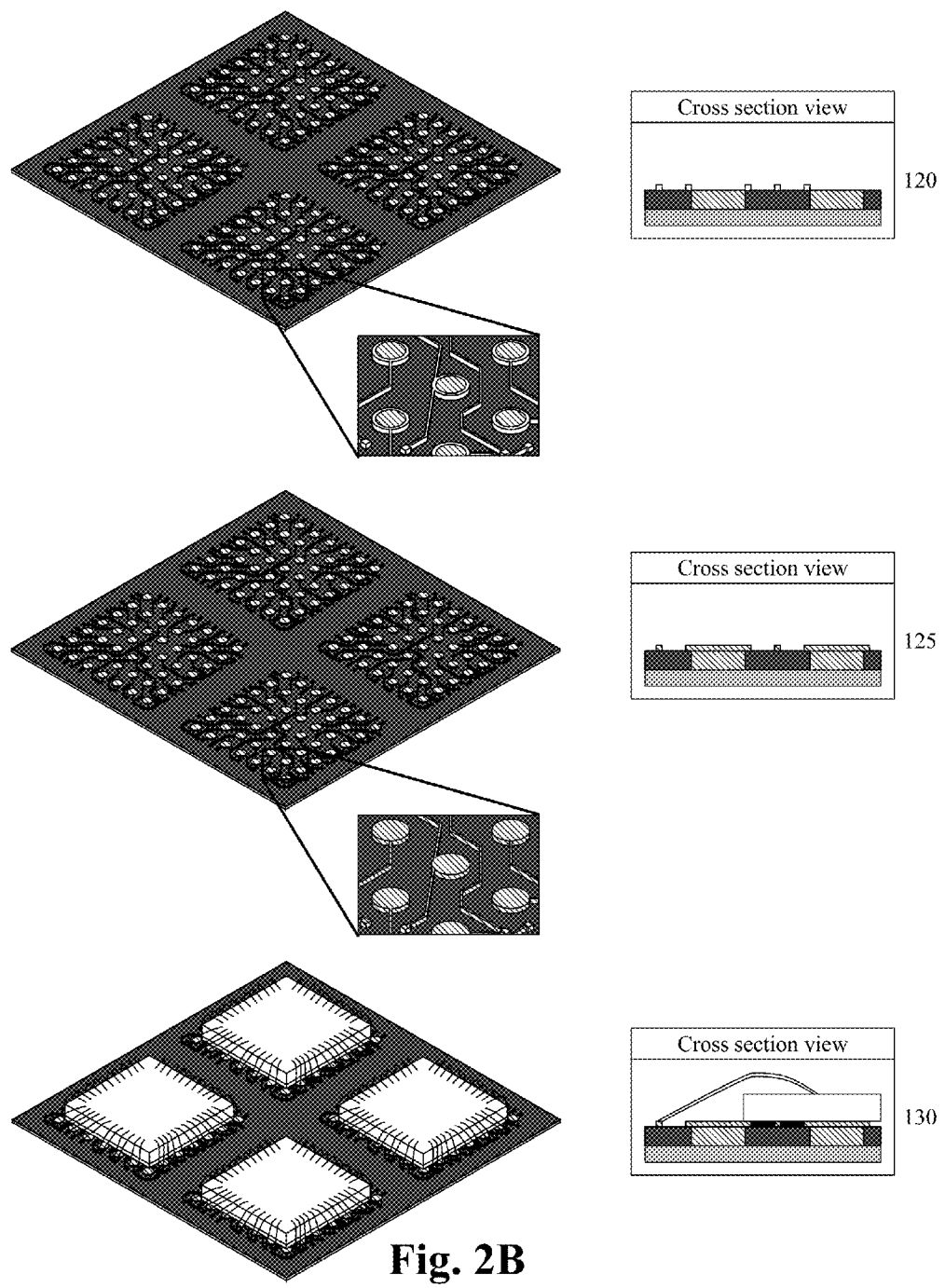
Figure 2C:
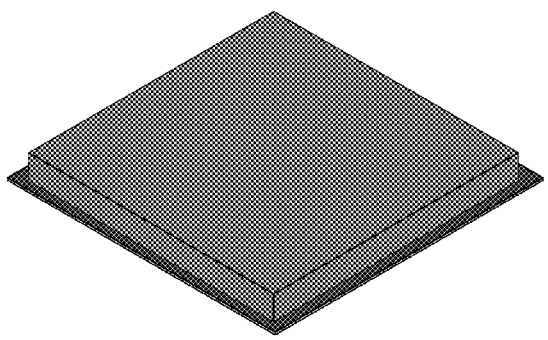
Figure 2C:
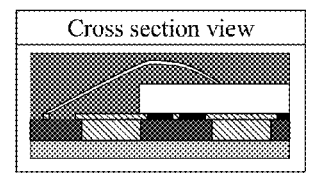
Figure 2C:
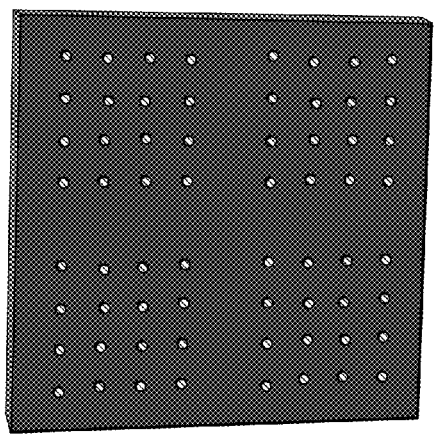
Figure 2C:
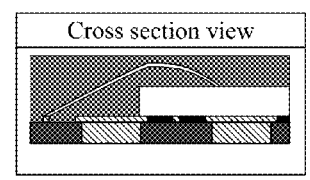
Figure 2C:
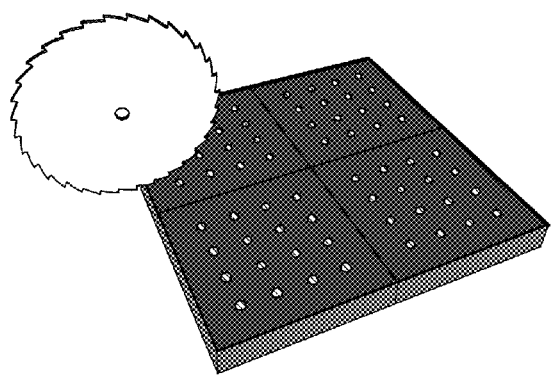

FIG. 1 illustrates an exemplary method 100 of manufacturing a semiconductor package in accordance with the present invention. An exemplary result produced by each step of the method 100 is illustrated in FIGS. 2A-2C. The method 100 begins at a step 105, where a sheet carrier is provided. In some embodiments, the sheet carrier is a pure copper leadframe strip. The leadframe strip can be of other suitable material.

At a step 110, a plurality of terminals is formed on the sheet carrier. In some embodiments, the plurality of terminals is formed by plating a plurality of patterns with Cu, Ag, NiPdAu, or other suitable material. The plurality of patterns can be of any shape and size. As illustrated in FIG. 2A, the patterns are cylindrical and equidistantly separated. The plurality of patterns eventually becomes the plurality of terminals.

At a step 115, the sheet carrier is molded with a first molding compound. The first molding compound surrounds the plurality of terminals on the sheet carrier. The height of the first molding compound is typically the same as the height of the plurality of terminals. The first molding compound includes a plastic polymer or resin.

At a step 120, electrical paths are formed for a first routing layer. In some embodiments, the electrical paths are formed by using catalytic ink to form the electrical paths during a process, such as, a screen printing process or an inkjet writing process. The catalytic ink is dropped on the first molding compound according to a pattern. The catalytic ink is dropped around the perimeter of each terminal and can extend planarly therefrom. The catalytic ink is formulated ink for initiating copper plating on the first routing layer. An exemplary catalytic ink is MicroCat manufactured by MacDermid Incorporated.

At a step 125, the first routing layer is plated. The plating is adhered to a portion of the first molding compound that had been initiated by the catalytic ink In other words, the plating is adhered to the electrical paths. The plating is also adhered to a top surface of each terminal. The first routing layer can be plated using an electro plating process or an electroless plating process. The electrical paths are typically conductive and form routings.

In some embodiments, if the first routing layer is the topmost routing layer, then the routings on the first routing layer are interconnection routings. The interconnection routings are electrically coupled with the terminals. In some embodiments, at least one interconnection routing extends planarly therefrom. In some embodiments, an interconnection routing is electrically coupled with at least another terminal. In some embodiments, a first interconnection routing is electrically coupled with a second interconnection routing. This interconnection routing layer is typically configured for coupling with dice.

At a step 130, dice are placed on the first routing layer. In some embodiments, the dice are coupled with the first routing layer via epoxy. As illustrated, the epoxy is filled in spaces between the interconnection routings, beneath the dice. Other adhesives can be used to couple the dice with the first routing layer. Bond wires couple dice terminals to the interconnection routings. The bond wires can be gold wires, copper wires or any suitable metallic wires.

At a step 135, the dice are encapsulated with a second molding compound, which also encapsulates the interconnection routings and the bond wires. The second molding compound includes a plastic polymer or resin. The second molding compound can be the same as or different from the first molding compound. The first molding compound and the second molding compound become part of a package compound.

At a step 140, the sheet carrier is removed. In some embodiments, the sheet carrier is removed by performing an etching process, which can be a dip process or a spray process. Once the sheet carrier is removed, the plurality of terminals is exposed at a bottom surface of the sheet carrier. Other processes for removing the sheet carrier are possible. Typically, the molding is minimally or not affected by the removal of the sheet carrier. For instance, when the sheet carrier comprises copper, and the removal step 140 involves using a chemical etchant, preferably, the etchant is selected such that the etchant is reactive with (removes) the sheet carrier with minimal effect to the molding. An example of such an etchant includes cupric chloride.

At a step 145, a singulation process is performed to separate semiconductor packages from the strip. Singulation can be done using a high-speed saw, a laser, a high-pressure water jet, or some other suitable means. After the step 145, the method 100 ends. The singulated packages are available for additional testing, processing, shipping and/or use.

Figure 2D:
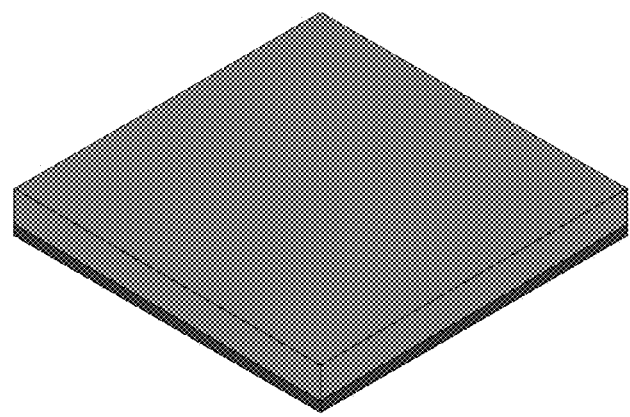
Figure 2D:
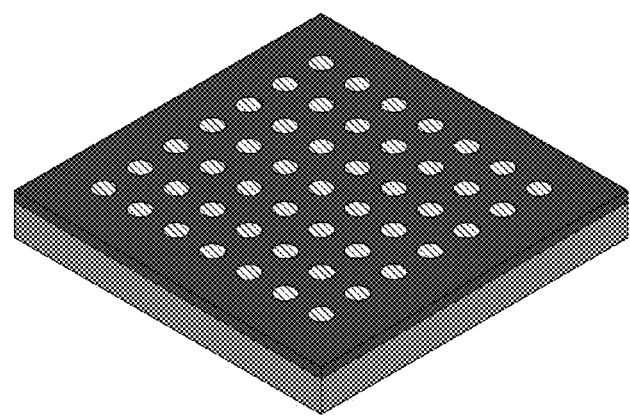
Figure 2D:
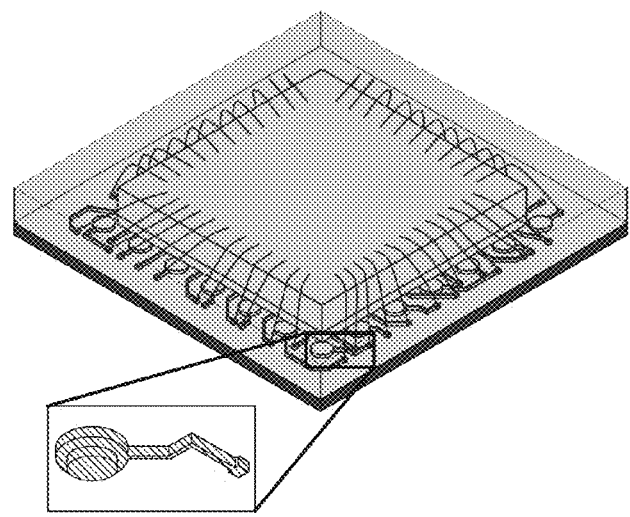

A singulated semiconductor package is illustrated in FIG. 2D, which shows a top side view and a bottom side view of the singulated semiconductor package. The terminals have exposed bottom surfaces that are substantially flush with a bottom surface of the semiconductor package. The terminals do not protrude from the semiconductor package. FIG. 2D also illustrates an x-rayed view of the top side of the semiconductor package, which shows interconnection routings located inside the semiconductor package. A shape of an interconnection routing and a terminal electrically coupled with the interconnection routing and any additional layers therebetween (together referred to as simply "terminal") is irregular and designed for locking with the package compound, which includes at least the first molding compound and the second molding compound.

Figure 3A:
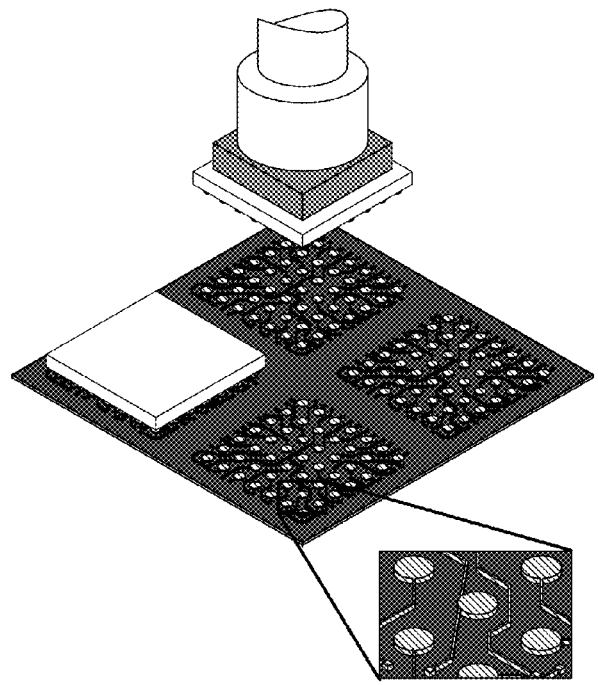
FIGS. 3A-3B illustrate another exemplary semiconductor package and a method of manufacturing the same in accordance with the present invention.
Figure 3B:
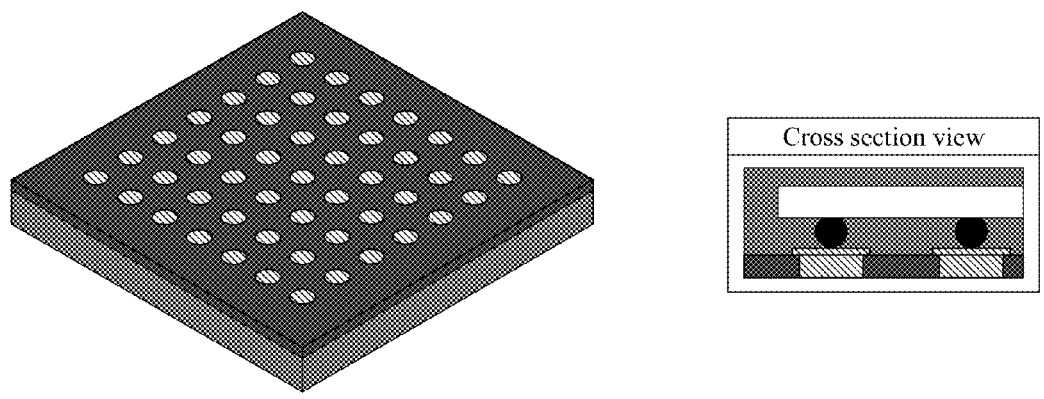

The method 100 is described relative to bond wire type packages. However, the method 100 is also applicable for flip chip type packages. Instead of using bond wires to couple the dice with the first routing layer at the step 130, solder balls are used to couple the dice with the first routing layer including the interconnection routings, as illustrated in FIG. 3A. FIG. 3B illustrates a completed, singulated flip chip package in accordance with the present invention.

Figure 4A:
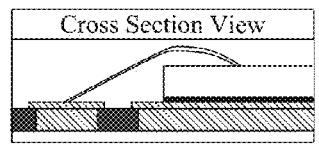
FIGS. 4A-4C illustrate yet another exemplary semiconductor package and a method of manufacturing the same in accordance with the present invention.
Figure 4B:
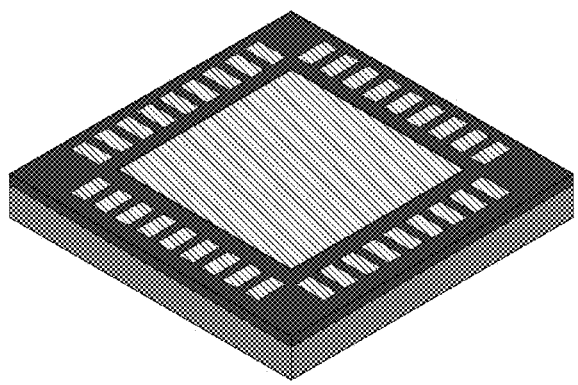
Figure 4B:
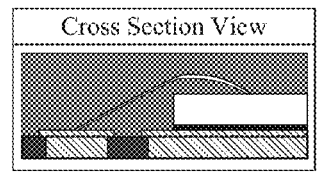
Figure 4C:
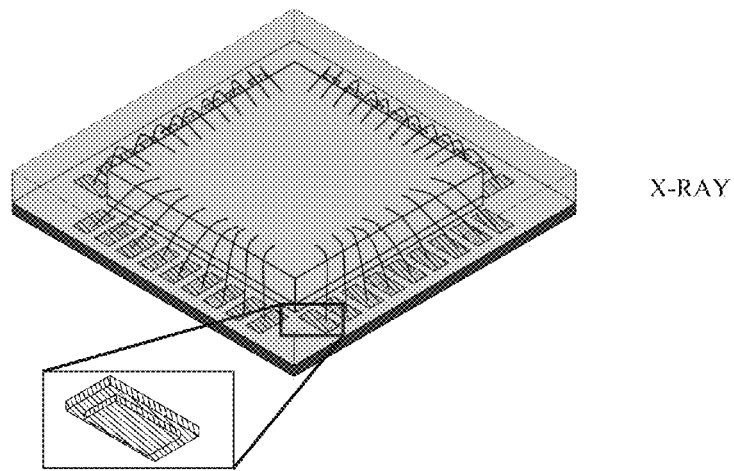

FIGS. 4A-4C illustrate yet another exemplary semiconductor package and a method of manufacturing the same in accordance with the present invention. FIG. 4A illustrates a base copper sheet carrier including package die attach pads and terminals. Similar to the method 100 for base sheet carrier fabrication, die attach pads and terminals are formed instead of interconnection routing terminals for thermal dissipation purposes. The dice are coupled with the die attach pads using an adhesive. Bond wires couple dice terminals with the interconnection routings. The bond wires can be gold wires, copper wires or any suitable metallic wires.

FIG. 4B illustrates a completed, singulated semiconductor package in accordance with the present invention. The semiconductor package in FIG. 4B has terminals and a die attach pad that have exposed bottom surfaces. The exposed bottom surfaces are substantially flush with a bottom surface of the semiconductor package. The terminals and the die attach pad do not protrude from the semiconductor package. The die attach pad of the semiconductor package is configured for thermal dissipation.

FIG. 4C illustrates an x-rayed view of a bottom side of the semiconductor package, which shows the terminals and the die attach pad. A shape of a terminal and a shape of the die attach pad are each irregular and designed for locking with the package compound.

In some instances, a semiconductor die requires a package that has a more complicated routing circuit than that of the embodiments described above, since a single routing layer is insufficient. The concepts of the present invention can also be applied for multilayer routing packages by forming at least one intermediary layer that couples with the first routing layer. An intermediary layer typically includes a via layer and a subsequent routing layer. The method 100 can be extended to include, after the plating for the first routing layer step (125) and before the placing dice on the first routing layer step (130) of FIG. 1, a process for creating an intermediary layer. In some embodiments, the subsequent routing layer becomes the topmost routing layer, which behaves as a bondable routing layer configured to couple with the dice using, for example, bond wires or solder balls.

Figure 5:
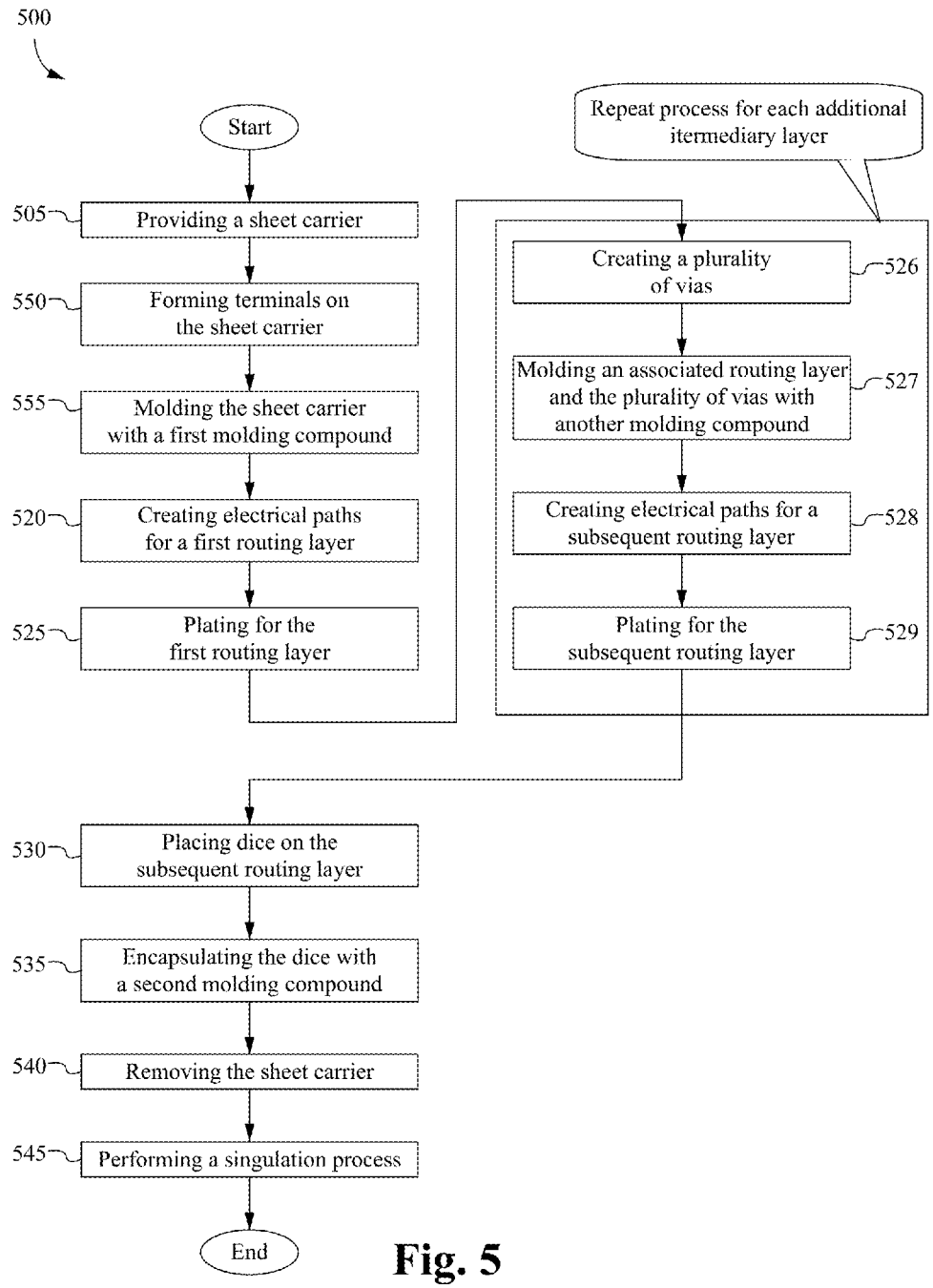
FIG. 5 illustrates an exemplary method of manufacturing a semiconductor package having a complicated routing circuit in accordance with the present invention.
Figure 6A:
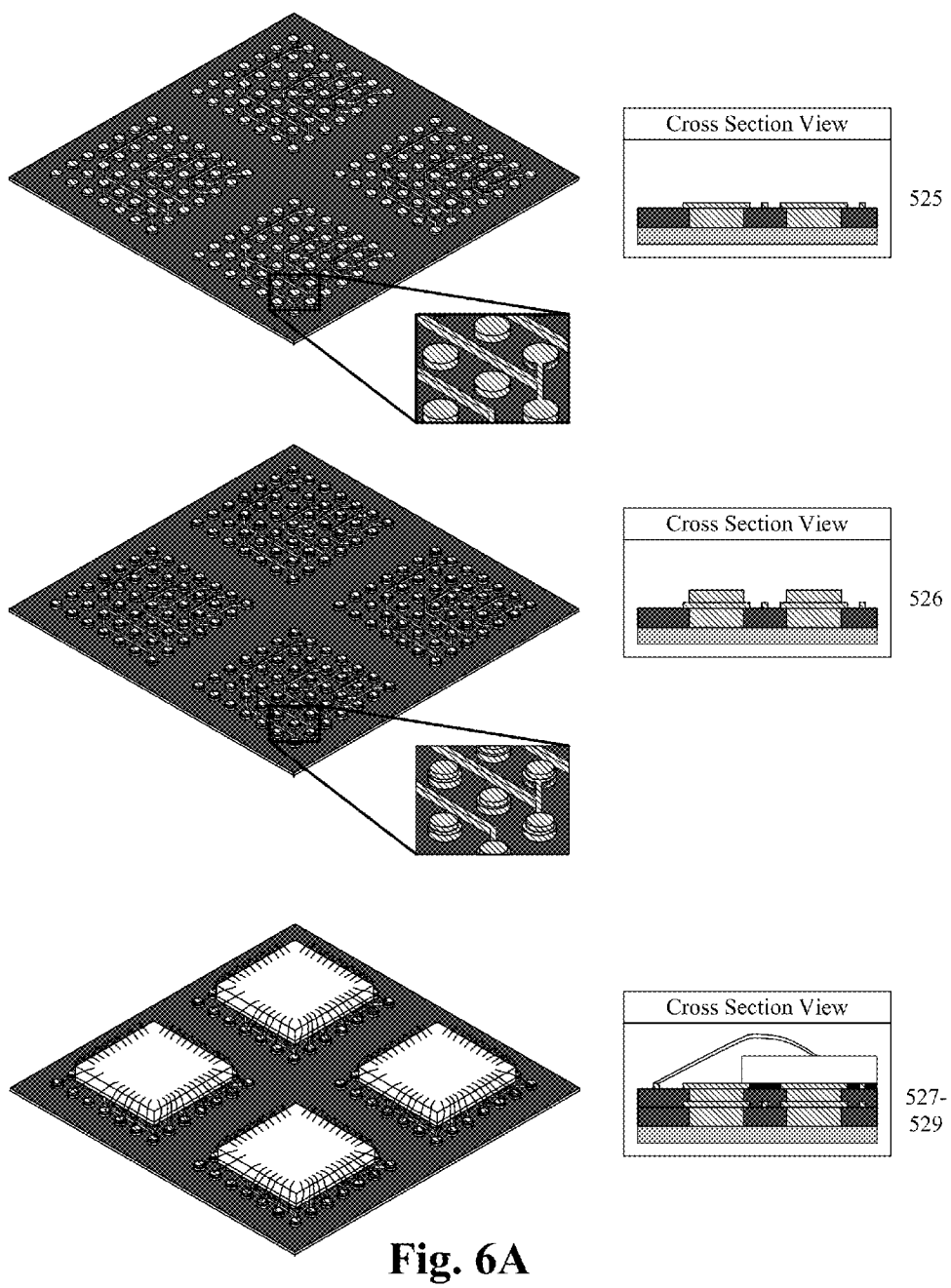

FIG. 5 illustrates an exemplary method 500 of manufacturing a semiconductor package having a complicated routing circuit in accordance with the present invention. FIG. 6A illustrates exemplary results produced at selected steps of the method of FIG. 5. Discussion regarding steps 505-525 of method 500 are omitted for clarity and brevity because they are similar to the steps 105-125 of method 100.

After the step 525, at a step 526, a plurality of vias is formed. The plurality of vias is formed on a topmost routing layer by plating the topmost routing layer. The topmost routing layer can be plated by an electro plating process or an electroless plating process. In some embodiments, the topmost routing layer is the first routing layer. The plurality of vias typically electrically couples with the terminals and extends nonplanarly therefrom. The plurality of vias is configured to electrically couple two routing layers. In some embodiments, the plurality of vias is similarly sized and shaped as the plurality of patterns. In some embodiments, the plurality of vias is aligned vertically and/or horizontally with the plurality of patterns. Alternatively, the plurality of vias is not aligned vertically and/or horizontally with the plurality of patterns, but instead, electrically couples with the plurality of patterns in a staggered manner.

At a step 527, the topmost routing layer and the plurality of vias are molded with another molding compound. The another molding compound surrounds the plurality of vias and the first routing layer. The height of the second molding compound is typically the same as the combined height of the plurality of vias and the first routing layer. The another molding compound includes a plastic polymer or resin.

At a step 528, electrical paths are formed for the subsequent routing layer. In some embodiments, the electrical paths are formed by using catalytic ink to form the electrical paths during a process, such as, a screen printing process or an inkjet writing process. The catalytic ink is dropped on the subsequent molding compound according to another pattern. The catalytic ink is dropped around the perimeter of each terminal and can be extended planarly therefrom. The catalytic ink is formulated ink for initiating copper plating on the subsequent routing layer. An exemplary catalytic ink is MicroCat manufactured by MacDermid Incorporated.

At a step 529, the subsequent routing layer is plated. The plating is adhered to a portion of the second molding compound that had been initiated by the catalytic ink In other words, the plating is adhered to the electrical paths. The plating is also adhered to a top surface of each terminal. The subsequent routing layer can be plated using an electro plating process or an electroless plating process. The electrical paths are typically conductive and form routings.

In some embodiments, the routings on the subsequent routing layer are associated routings. Each associated routing is electrically coupled with a terminal and extends planarly therefrom. In some embodiments, an associated routing is electrically coupled with at least another terminal. In some embodiments, a first associated routing is electrically coupled with a second associated routing.

In some embodiments, if the subsequent routing layer becomes the topmost routing layer, then the routings of the subsequent routing layer are interconnection routings. In some embodiments, each interconnection routing is electrically coupled with a terminal and extends planarly therefrom. In some embodiments, an interconnection routing is electrically coupled with at least another terminal. In some embodiments, a first interconnection routing is electrically coupled with a second interconnection routing. This interconnection routing layer is typically configured for coupling with dice.

Typically, the steps 526-529 can be repeated for each additional intermediary layer. A pattern formed by associated routings of a subsequent routing layer can be the same as or different from a pattern formed by interconnection routings of a layer of interconnection routings. Similarly, the pattern formed by the associated routings of the subsequent routing layer can be the same as or different from a pattern formed by interconnection routings of another subsequent routing layer.

The method 500 continues with steps 530-545, which are omitted for the sake of clarity and brevity because they are similar to the steps 130-145 of method 100. After the step 545, the method 500 ends.

FIG. 6B illustrate a singulated semiconductor package having two routing layers in accordance with the present invention. With the molding compound, die, and bonds wires or solder balls removed, each plating layer is shown in exploded view. The first plating layer includes terminals of the package. The second plating layer includes an associated routing layer. The third plating layer includes vias that link routing layers. The fourth plating layer includes a bondable layer on which the die is placed for a wire bond type package or a flip chip type package. Plating of each layer has width dimensions different from that of adjacent layers. The layers can have the same or different height dimensions. As discussed above, each layer is formed separately from other layers.

Figure 7:
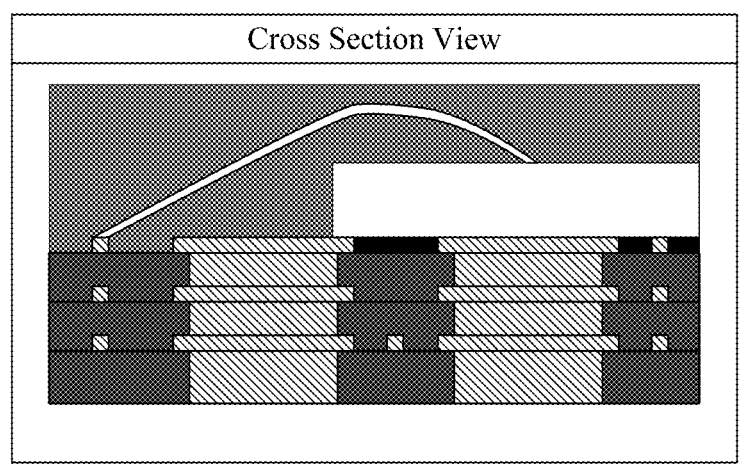
FIG. 7 illustrates a cross-sectional view of an exemplary semiconductor package having three routing layers in accordance with the present invention.

In case two routing layers are insufficient, the concept illustrated in FIGS. 6A-6B of building two routing layers (e.g., steps 526-529) can be repeated for each additional layer. FIG. 7 illustrates a cross-sectional view of an exemplary semiconductor package having three routing layers in accordance with the present invention.

Figure 8:
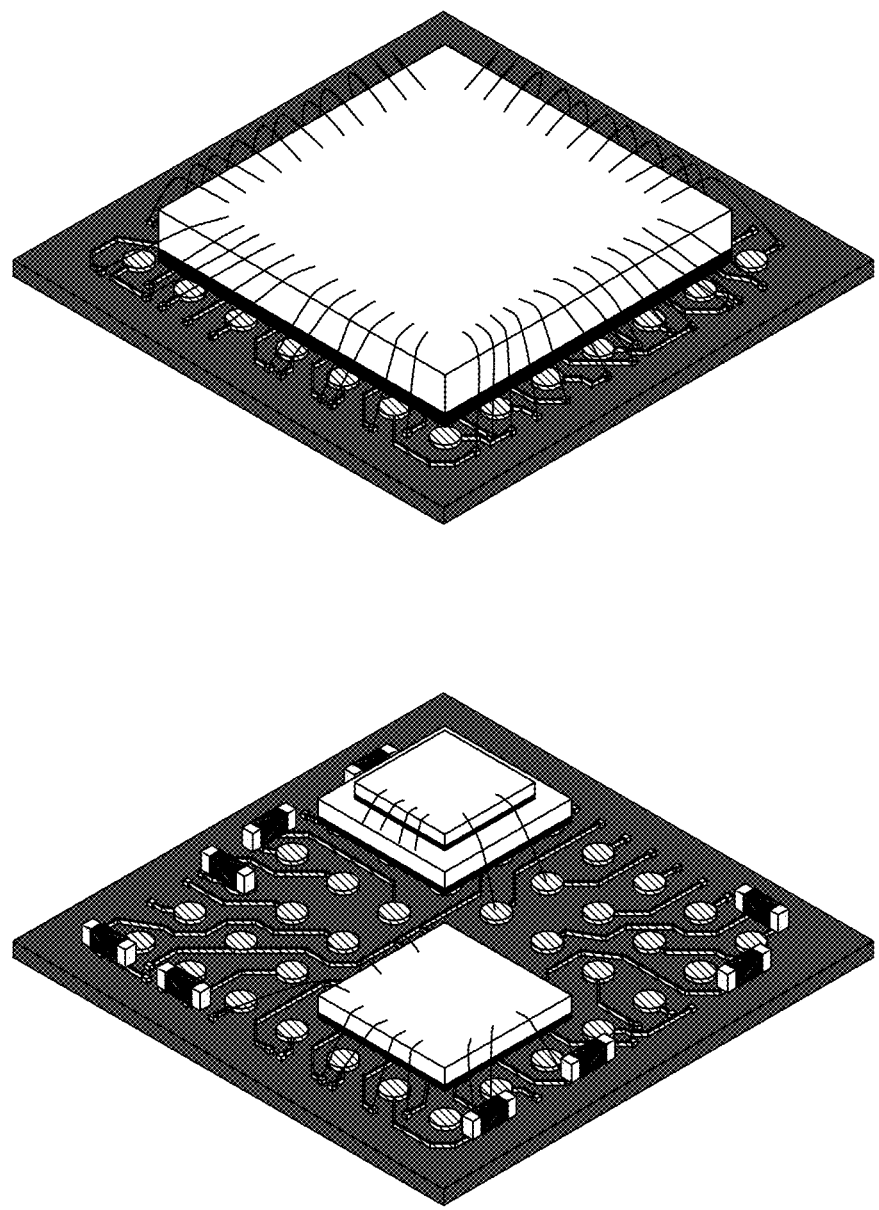
FIG. 8 illustrates an exemplary semiconductor package having a plurality of semiconductor dies in accordance with the present invention.

In some embodiments, in any of the aforementioned semiconductor packages, a semiconductor package can also include at least one other die coupled with a die (e.g., stacked dice), at least two dice mounted on the topmost routing layer (e.g., interconnection routing layer), or both within the semiconductor package. FIG. 8 illustrates exemplary semiconductor packages each having a plurality of semiconductor dies in accordance with the present invention.

Figure 9:
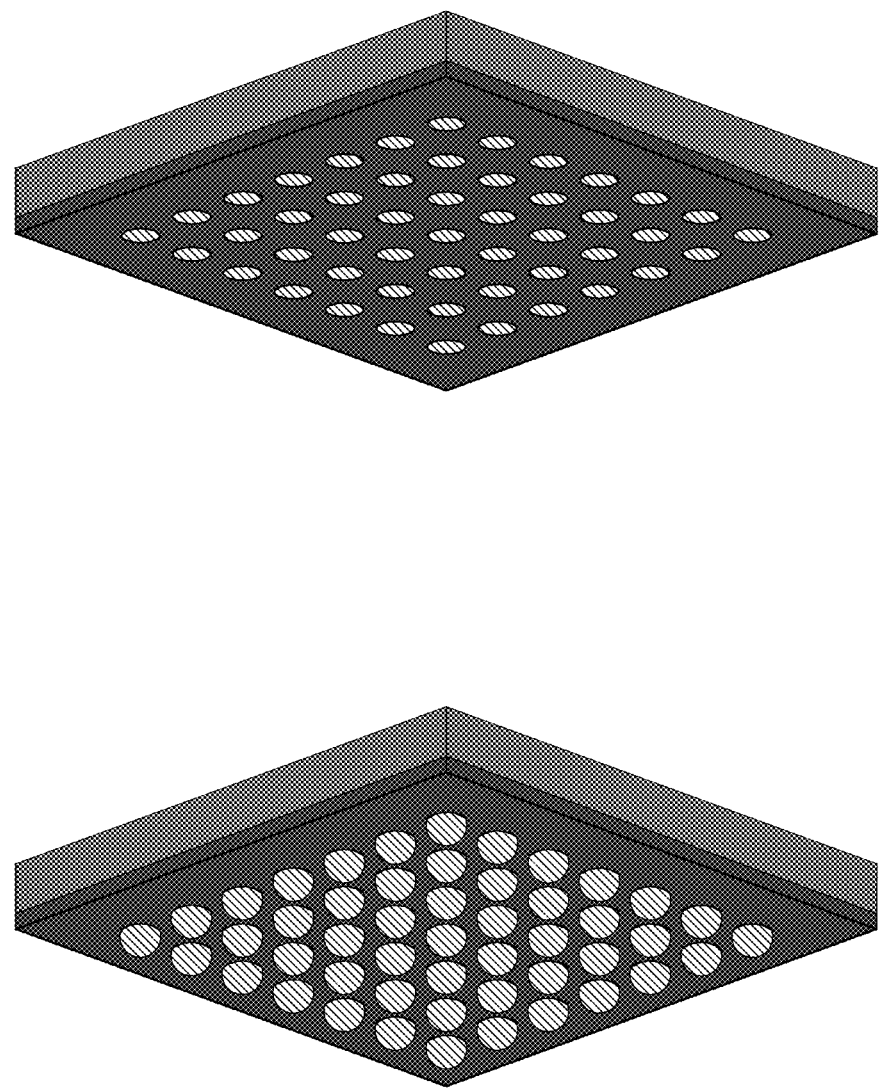
FIG. 9 illustrates an exemplary semiconductor package having increased terminal package standoff in accordance with the present invention.

In some embodiments, in any of the aforementioned semiconductor packages, a semiconductor package can also include solder balls that couple with the terminals. The solder balls extend away from the semiconductor package to thereby increase terminal package standoff. FIG. 9 illustrates an exemplary semiconductor package having increased terminal package standoff in accordance with the present invention.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A semiconductor package comprising:
   a. a die;
   b. terminals, each terminal including an exposed surface that is flush with a bottom surface of the semiconductor package;
   c. interconnection routings forming an interconnection routing layer, the interconnection routing layer coupling with the die; and
   d. a package compound including:
      i. a top molding compound encapsulating the interconnection routings and the die; and
      ii. a bottom molding compound surrounding the terminals, wherein the top molding compound interfaces with the bottom molding compound, wherein the interconnection routings are electrically coupled with the terminals, wherein at least one of the interconnection routings includes catalytic ink on the bottom molding compound, around a perimeter of one of the terminals and extends planarly away from the one of the terminals according to a design pattern.

2. The semiconductor package of claim 1, wherein a shape of one of the interconnection routings and a terminal electrically coupled with the one of the interconnection routings is irregular to lock with the top molding compound and the bottom molding compound.

3. The semiconductor package of claim 1, wherein a first of the interconnection routings is coupled with a second of the interconnection routings.

4. The semiconductor package of claim 1, further comprising wire bonds coupling the die with the interconnection routing layer.

5. The semiconductor package of claim 1, further comprising at least one other die coupled with at least one of the die and the interconnection routing layer.

6. The semiconductor package of claim 1, further comprising solder balls coupled with the terminals, wherein the solder balls extend away from the semiconductor package.

7. A semiconductor package comprising:
   a. terminals, each terminal including an exposed bottom surface;
   b. a primary routing layer positioned within the semiconductor package and including primary routings electrically coupled with the terminals, wherein at least one of the primary routings extends planarly therefrom;
   c. at least one die electrically coupled with the primary routing layer, wherein epoxy is filled in spaces between the primary routings, beneath the at least one die; and
   d. two molding compounds, wherein a first of the two molding compounds encapsulates the terminals, and a second of the two molding compounds encapsulates the primary routings and the at least one die, wherein the first molding compound interfaces with the second molding compound, wherein at least one of the primary routings includes catalytic ink on the first of the two molding compounds, around a perimeter of one of the terminals and extending planarly away from the one of the terminals according to a design pattern.

8. The semiconductor package of claim 7, wherein one of the primary routings is electrically coupled with at least another terminal.

9. The semiconductor package of claim 7, further comprising a locking mechanism for fastening a package compound with the primary routings and the terminals.

10. The semiconductor package of claim 7, wherein the primary routings electrically coupled with the terminals extend outside an area that the at least one die is electrically coupled with the primary routing layer is located at.

11. The semiconductor package of claim 7, wherein the first molding compound is the same material as the second molding compound.

12. The semiconductor package of claim 7, wherein the first molding compound is of a different material than the second molding compound.

13. The semiconductor package of claim 1, wherein the at least one of the interconnection routings also includes plating that is adhered to the catalytic ink and a non-exposed top surface of the one of the terminals.

14. The semiconductor package of claim 13, wherein a first end of the at least one of the interconnection routings is at the one of the terminals and a second end of the at least one of the interconnection routings is at a location outside an area that is beneath the die.

15. The semiconductor package of claim 1, wherein the catalytic ink is not within the perimeter of the one of the terminals.

16. A semiconductor package comprising:
a. a die;
b. terminals, each terminal including an exposed surface that is flush with a bottom surface of the semiconductor package;
c. interconnection routings forming an interconnection routing layer, the interconnection routing layer coupling with the die; and
d. a package compound including:
1. a top molding compound encapsulating the interconnection routings and the die; and
2. a bottom molding compound surrounding the terminals, wherein the top molding compound interfaces with the bottom molding compound, wherein the interconnection routings are electrically coupled with the terminals, wherein at least one of the interconnection routings includes catalytic ink on the bottom molding compound, wherein the catalytic ink is around a perimeter of one of the terminals that is disposed in the bottom molding compound and extends planarly away from the one of the terminals according to a design pattern.

* * * * *